US008068528B2

(12) United States Patent
Edamura et al.

(10) Patent No.: US 8,068,528 B2
(45) Date of Patent: Nov. 29, 2011

(54) QUANTUM CASCADE LASER

(75) Inventors: Tadataka Edamura, Hamamatsu (JP); Naota Akikusa, Hamamatsu (JP); Kazuue Fujita, Hamamatsu (JP); Atsushi Sugiyama, Hamamatsu (JP); Takahide Ochiai, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 12/523,277

(22) PCT Filed: Jun. 6, 2007

(86) PCT No.: PCT/JP2007/061460
§ 371 (c)(1),
(2), (4) Date: Sep. 1, 2009

(87) PCT Pub. No.: WO2008/087754
PCT Pub. Date: Jul. 24, 2008

(65) Prior Publication Data
US 2010/0111127 A1 May 6, 2010

(30) Foreign Application Priority Data
Jan. 18, 2007 (JP) .................. P2007-009519

(51) Int. Cl.
*H01S 5/00* (2006.01)
(52) U.S. Cl. ............. 372/45.01; 372/45.012; 372/43.01; 372/44.01
(58) Field of Classification Search ............. 372/45.012, 372/45.01, 43.01, 44.01
See application file for complete search history.

(56) References Cited

U.S. PATENT DOCUMENTS
5,457,709 A 10/1995 Capasso et al.
(Continued)

FOREIGN PATENT DOCUMENTS
JP 8-279647 10/1996
(Continued)

OTHER PUBLICATIONS
M. Beck et al., "Continuous Wave Operation of a Mid-Infrared Semiconductor Laser at Room Temperature," Science, vol. 295, Jan. 11, 2002, pp. 301-305.

(Continued)

*Primary Examiner* — Patrick Stafford
(74) *Attorney, Agent, or Firm* — Drinker Biddle & Reath LLP

(57) ABSTRACT

A quantum cascade laser includes a semiconductor substrate, and an active layer which is provided on the semiconductor substrate, and has a cascade structure in which unit laminate structures 16 having quantum well emission layers 17 and injection layers 18 are laminated in multiple stages. Further, the quantum cascade laser is configured such that the unit laminate structure 16 has an emission upper level $L_{up}$, an emission lower level $L_{low}$, and a relaxation miniband MB including an energy level lower than the emission lower level in its subband level structure, and light is generated by an intersubband transition of electrons from the upper level to the lower level, and the electrons after the intersubband transition are relaxed from the lower level $L_{low}$ to the miniband MB through LO phonon scattering, to be injected from the injection layer 18 to the latter stage emission layer via the miniband MB. Thereby, the quantum cascade laser which is capable of efficiently forming an inverted population in the quantum well emission layer, to improve its laser operation performance, is realized.

4 Claims, 7 Drawing Sheets

U.S. PATENT DOCUMENTS

| | | | |
|---|---|---|---|
| 5,745,516 A | | 4/1998 | Capasso et al. |
| 6,137,817 A | * | 10/2000 | Baillargeon et al. ....... 372/45.01 |
| 6,751,244 B2 | | 6/2004 | Faist et al. |
| 6,922,427 B2 | | 7/2005 | Faist et al. |
| 2004/0161009 A1 | * | 8/2004 | Edamura et al. ................ 372/45 |

FOREIGN PATENT DOCUMENTS

| | | |
|---|---|---|
| JP | 10-144995 | 5/1998 |
| JP | 2004-507903 | 3/2004 |
| JP | 2004-521481 | 7/2004 |

OTHER PUBLICATIONS

J.S. Yu et al., "High-power continuous-wave operation of a 6 μm quantum-cascade laser at room temperature," Applied Physics Letters, vol. 83, No. 13, Sep. 29, 2003, pp. 2503-2505.

A. Evans et al., "Continuous-wave operation of λ~4.8 μm quantum-cascade lasers at room temperature," Applied Physics Letters, vol. 85, No. 12, Sep. 20, 2004, pp. 2166-2168.

A. Tredicucci et al., "High performance Interminiband quantum cascade lasers with graded superlattices," Applied Physics Letters, vol. 73, No. 15, Oct. 12, 1998, pp. 2101-2103.

D. Hofstetter et al., "High-temperature operation of distributed feedback quantum-cascade lasers at 5.3 μm," Applied Physics Letters, vol. 78, No. 4, Jan. 22, 2001, pp. 396-398.

S. Blaser et al., "Room-temperature, continuous-wave, single-mode quantum-cascade lasers at λ~5.4 μm," Applied Physics Letters, vol. 86, 2005, pp. 41109-1 through 41109-3.

\* cited by examiner

Fig.6

| SEMICONDUCTOR LAYER | | COMPOSITION | LAYER THICKNESS | DOPING |
|---|---|---|---|---|
| INJECTION BARRIER LAYER 171 | | InAlAs | 4.2nm | undoped |
| EMISSION LAYER 17 | WELL LAYER 161 | InGaAs | 1.3nm | undoped |
| | BARRIER LAYER 172 | InAlAs | 1.2nm | undoped |
| | 162 | InGaAs | 4.8nm | undoped |
| | 173 | InAlAs | 1.2nm | undoped |
| | 163 | InGaAs | 4.3nm | undoped |
| | 174 | InAlAs | 1.4nm | undoped |
| | 164 | InGaAs | 3.9nm | undoped |
| | 175 | InAlAs | 1.8nm | undoped |
| | 165 | InGaAs | 3.4nm | undoped |
| EXIT BARRIER LAYER 191 | | InAlAs | 2.1nm | undoped |
| INJECTION LAYER 18 | WELL LAYER 181 | InGaAs | 2.5nm | undoped |
| | BARRIER LAYER 192 | InAlAs | 1.9nm | undoped |
| | 182 | InGaAs | 2.3nm | undoped |
| | 193 | InAlAs | 2.0nm | Si doped: $3 \times 10^{17}/cm^3$ |
| | 183 | InGaAs | 2.2nm | Si doped: $3 \times 10^{17}/cm^3$ |
| | 194 | InAlAs | 2.1nm | Si doped: $3 \times 10^{17}/cm^3$ |
| | 184 | InGaAs | 2.1nm | Si doped: $3 \times 10^{17}/cm^3$ |
| | 195 | InAlAs | 2.3nm | undoped |
| | 185 | InGaAs | 2.0nm | undoped |
| | 196 | InAlAs | 3.0nm | undoped |
| | 186 | InGaAs | 2.0nm | undoped |

QUANTUM CASCADE LASER

TECHNICAL FIELD

The present invention relates to a quantum cascade laser utilizing an intersubband transition in a quantum well structure.

BACKGROUND ART

Light in a mid-infrared wavelength region (for example, at a wavelength of 5 to 30 μm) has become an important wavelength region in the field of spectroscopic analysis. As a high-performance semiconductor light source in such a wavelength region, in recent years, quantum cascade lasers (QCL) have gained the spotlight (for the quantum cascade lasers, refer to Patent Documents 1 to 4 and Non Patent Documents 1 to 4, for example).

The quantum cascade laser is a monopolar type laser element that generates light by an electron transition between subbands by utilizing a level structure with subbands, which is formed in a semiconductor quantum well structure, that is capable of realizing high-efficiency and high-power operations by cascade coupling quantum well emission layers in multiple stages which are formed by quantum well structures to be an active region. Further, the cascade coupling of the quantum well emission layers is realized by using an electron injection layer for injecting electrons into the emission upper level, and alternately laminating the quantum well emission layers and the injection layers.

Patent Document 1: U.S. Pat. No. 5,457,709
Patent Document 2: U.S. Pat. No. 5,745,516
Patent Document 3: U.S. Pat. No. 6,751,244
Patent Document 4: U.S. Pat. No. 6,922,427
Non Patent Document 1: M. Beck et al., "Continuous Wave Operation of a Mid-Infrared Semiconductor Laser at Room Temperature," Science Vol. 295 (2002) pp. 301-305
Non Patent Document 2: J. S. Yu et al., "High-Power Coutinuous-Wave Operation of a 6 μm Quantum-Cascade Laser at Room Temperature," Appl. Phys. Lett. Vol. 83 (2003) pp. 2503-2505
Non Patent Document 3: A. Evans et al., "Continuous-Wave Operation of λ~4.8 μm Quantum-Cascade Lasers at Room Temeprature," Appl. Phys. Lett. Vol. 85 (2004) pp. 2166-2168
Non Patent Document 4: A. Tredicucci et al., "High Performance Interminiband Quantum Cascade Lasers with Graded Superlattices," Appl. Phys. Lett. Vol. 73 (1998) pp. 2101-2103

DISCLOSURE OF THE INVENTION

Problems to be Solved by the Invention

At the initial achievement of laser oscillation, the above described quantum cascade laser was limited in temperature for driving the element to an extremely low temperature, however, in 2002, a continuous wave operation at room temperature and at an oscillation wavelength of 9.1 μm was achieved by M. Beck et al. (Non Patent Document 1: M. Beck et al., Science Vol. 295 (2002) pp. 301-305). Further, thereafter, continuous wave operations at room temperature and at oscillation wavelengths of 6 μm and 4.8 μm as well have been achieved by a group of M. Razeghi et al. (Non Patent Document 2: J. S. Yu et al., Appl. Phys. Lett. Vol. 83 (2003) pp. 2503-2505, Non Patent Document 3: A. Evans et al., Appl. Phys. Lett. Vol. 85 (2004) pp. 2166-2168).

In order to realize a CW operation of a quantum cascade laser under an operating condition of a high temperature higher than room temperature, it is necessary to improve the heat radiation performance of the element, and in addition lower a threshold of a laser operation by efficiently forming an inverted population. In this way, in order to efficiently form an inverted population between an emission upper level and an emission lower level in an emission operation by an electron transition between subbands in an active layer, it is important to efficiently inject electrons into the emission upper level and to suppress a carrier distribution in the emission lower level (to shorten a carrier lifetime).

For example, in the laser element disclosed in Patent Document 1: U.S. Pat. No. 5,457,709, the structure in which an active layer including an emission layer having triple quantum wells is used, and a thin quantum well layer is provided so as to be immediately adjacent to an injection barrier between the electron injection layer and the quantum well emission layer, enables to improve the efficiency of injecting electrons into the emission upper level (E3) ($\eta=0.87$).

Further, in the laser element in Patent Document 1, a relaxation level (E1) lower by energy of polar longitudinal optical (LO) phonons is provided as an energy level lower than the emission lower level (E2), and electrons are extracted at high speed from the emission lower level through LO phonon scattering, which realizes shortening a carrier lifetime ($\tau_{E2}$=approximately 0.4 ps) in the emission lower level. However, in this structure, a tunnel time from the quantum well emission layer to the injection layer is relatively long, that is $\tau_{esc}$=2 to 3 ps, which substantially limits extraction of electrons at high speed through LO phonon scattering. Further, in this case, the carriers remaining in the level to which carriers are extracted are thermally redistributed, which leads to a factor that deteriorates the temperature characteristic of the element.

On the other hand, in the laser element disclosed in Patent Document 2: U.S. Pat. No. 5,745,516, a transition between minibands of superlattices is used. In such a structure, it is possible to easily form an inverted population by relaxation of carriers at high speed in the miniband of the emission lower level. For example, in the structure of A. Tredicucci et al. (Non Patent Document 4: A. Tredicucci et al., Appl. Phys. Lett. Vol. 73 (1998) pp. 2101-2103), a carrier lifetime in the miniband of the emission lower level is estimated as approximately 0.1 ps. However, this structure has a problem that, because a transition between minibands is used, there are many levels contributing to emission of light, the emission gain is deconcentrated to broaden its half value of width. Further, there are problems that a layer thickness per one period in the active layer is made thicker, the efficiency of injecting electrons into the emission upper level is low ($\eta$=0.76), etc.

Further, as a structure of an active layer against these problems, a double phonon resonance structure (Patent Document 3: U.S. Pat. No. 6,751,244, corresponding Japanese Patent Publication: Japanese Translation of International Application (Kohyo) No. 2004-521481), and a BTC (Bound to Continuum) structure (Patent Document 4: U.S. Pat. No. 6,922,427, corresponding Japanese Patent Publication: Japanese Translation of International Application (Kohyo) No. 2004-507903) have been proposed. However, even quantum cascade lasers having these structures have not been provided with sufficient performances under an operating condition at room temperature, etc.

The present invention has been achieved in order to solve the above described problems, and an object of the present invention is to provide a quantum cascade laser which is capable of efficiently forming an inverted population in a quantum well emission layer, to improve a laser operation performance.

Means for Solving the Problems

In order to achieve the above object, a quantum cascade laser according to the present invention includes (1) a semiconductor substrate, and (2) an active layer which is provided on the semiconductor substrate, and in which unit laminate structures having quantum well emission layers and injection layers are laminated in multiple stages to form a cascade structure in which the quantum well emission layers and the injection layers are alternately laminated, and in the quantum cascade laser, (3) each of the unit laminate structures included in the active layer has an emission upper level, an emission lower level, and a relaxation miniband including an energy level lower than the emission lower level to function as a relaxation level in a subband level structure thereof, and (4) light is generated by an intersubband transition of electrons from the emission upper level to the emission lower level in the quantum well emission layer, and the electrons after the intersubband transition are relaxed from the emission lower level to the relaxation miniband through longitudinal optical phonon scattering, to be injected from the injection layer to the quantum well emission layer in the latter stage unit laminate structure via the relaxation miniband.

In the quantum cascade laser described above, in addition to the emission upper level and the emission lower level relating to emission of light, the relaxation miniband which is a miniband including energy levels lower than the emission lower level is provided in the subband level structure in the unit laminate structure having the quantum well emission layer and the injection layer. Then, the subband level structure is configured such that an energy difference between the emission lower level and the relaxation miniband corresponds to energy of the longitudinal optical phonon (LO phonon).

In such a structure, electrons after an emission transition between subbands in the quantum well emission layer are extracted at high speed from the emission lower level through LO phonon scattering and relaxation in the miniband. Accordingly, it is possible to efficiently form an inverted population in the quantum well emission layer and lower a threshold of a laser operation thereby, which makes it possible to improve its laser operation performance.

Further, in the above described configuration using LO phonon scattering for extraction of electrons from the emission lower level to the relaxation miniband, because an emission transition between the emission upper level and the lower level is a transition between subbands, its emission gain can be concentrated. Further, because the miniband is used for relaxation of electrons after intersubband transition, the structure design for relaxing electrons from the emission lower level is made easier, and it is possible to realize stabilization of their characteristics at the time of manufacturing laser elements and improvement in its yield. Note that, the subband level structure as described above can be controlled by a design of the quantum well structure in the unit laminate structure forming the active layer.

EFFECTS OF THE INVENTION

In accordance with the quantum cascade laser of the present invention, the quantum cascade laser is configured such that not only the emission upper level and the emission lower level, but also the relaxation miniband which includes an energy level lower than the emission lower level are provided in the subband level structure in the unit laminate structure forming the active layer, and electrons after the intersubband transition are extracted at high speed from the emission lower level through the LO phonon scattering and relaxation in the miniband, which makes it possible to efficiently form an inverted population in the emission layer.

BRIEF DESCRIPTION OF THE DRAWINGS

FIG. 6 is a chart showing an example of a structure of a unit laminate structure of one period in the active layer.

Figure 1:
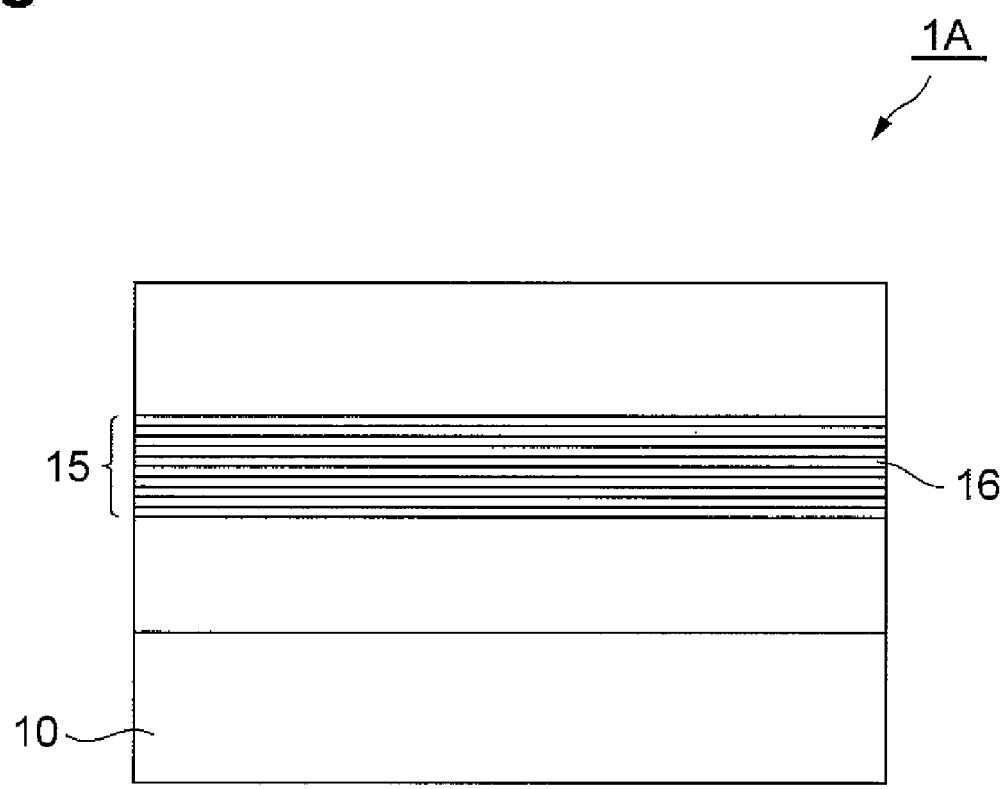
FIG. 1 is a diagram schematically showing a basic configuration of a quantum cascade laser.

DESCRIPTION OF THE SYMBOLS 1A, 1B—Quantum cascade laser, 10—Semiconductor substrate, 15—Active layer, 16—Unit laminate structure, 17—Quantum well emission layer, 18—Injection layer, 50—InP substrate, 51—InGaAs lower core layer, 52—InGaAs upper core layer, 53—InP cladding layer, 54—InGaAs contact layer, $L_{up}$—Emission upper level, $L_{low}$—Emission lower level, MB—Relaxation miniband.

BEST MODES FOR CARRYING OUT THE INVENTION

Hereinafter, a preferred embodiment of a quantum cascade laser according to the present invention will be described in detail with reference to the drawings. Note that, the same components are denoted by same reference symbols in the description of the drawings, and overlapping descriptions will be omitted. Further, the dimensional ratios in the drawings do not correspond to those in the description.

FIG. 1 is a diagram schematically showing a basic configuration of a quantum cascade laser according to the present invention. A quantum cascade laser 1A in the present embodiment is a monopolar type laser element that generates light by utilizing an electron transition between subbands in a semiconductor quantum well structure. The quantum cascade laser 1A comprises a semiconductor substrate 10 and an active layer 15 formed on the semiconductor substrate 10. Further, mirror surfaces (not shown) forming an optical resonator are formed on predetermined two surfaces facing each other of the side surfaces of the quantum cascade laser 1A.

The active layer 15 has a cascade structure in which quantum well emission layers used for generating light and electron injection layers used for injecting electrons into the emission layers are alternately laminated in multiple stages. In detail, a semiconductor laminated structure having a quantum well emission layer and an injection layer serves as a unit laminate structure 16 of one period, and unit laminate structures 16 are laminated in multiple stages, to form the active layer 15 having the cascade structure. The number of laminations of the unit laminate structures 16 including the quantum well emission layers and the injection layers is appropriately set and, for example, is about several hundred. Further, the active layer 15 is formed directly on the semiconductor substrate 10 or via another semiconductor layer.

Figure 2:
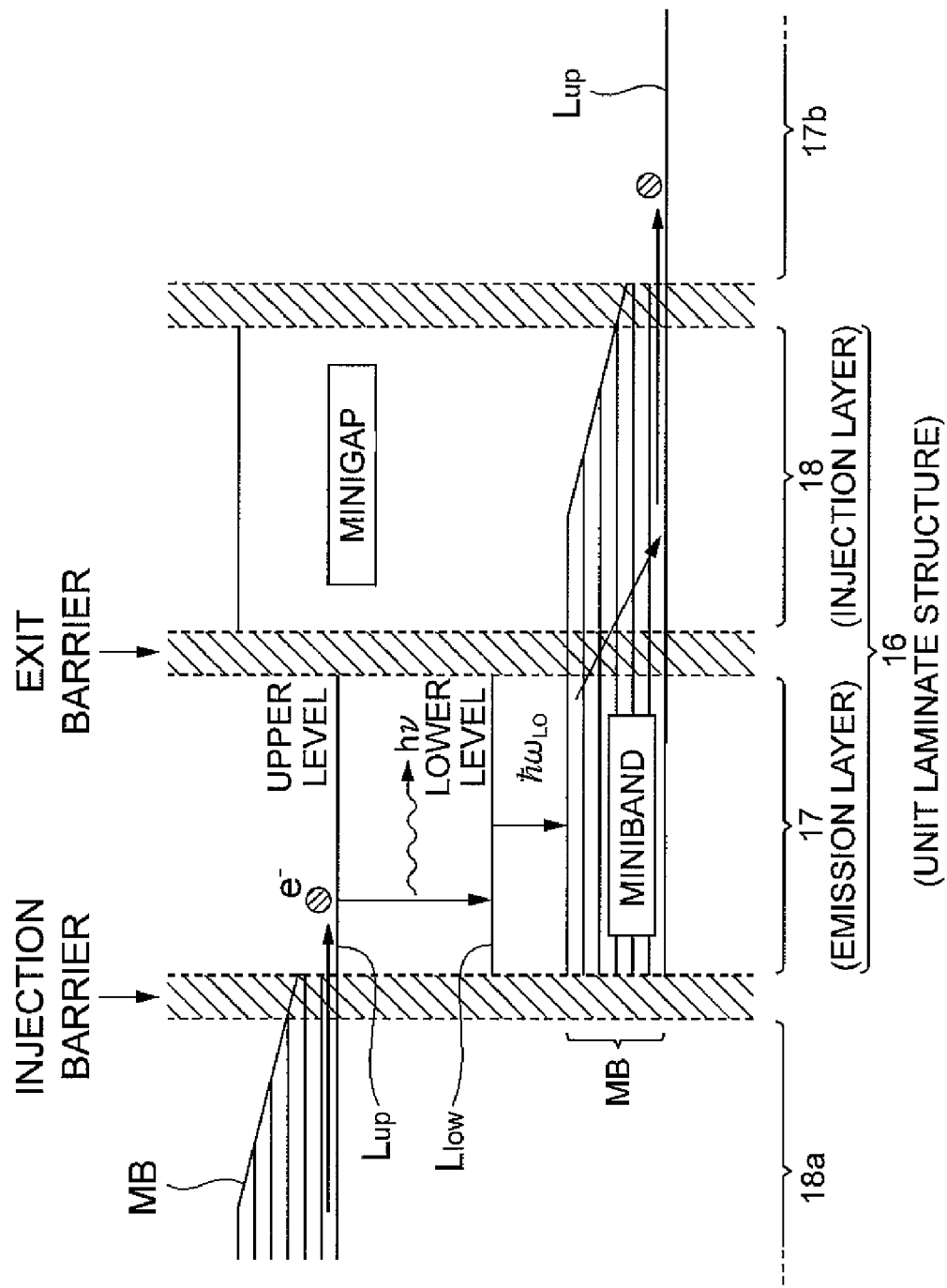
FIG. 2 is a diagram showing a subband level structure in an active layer of the quantum cascade laser shown in FIG. 1.

FIG. 2 is a diagram of a subband level structure in the active layer of the quantum cascade laser shown in FIG. 1. As shown in FIG. 2, each of the unit laminate structures 16 included in the active layer 15 is composed of a quantum well emission layer 17 and an injection layer 18. The quantum well emission layer 17 and the injection layer 18 are formed so as to respectively have predetermined quantum well structures including a quantum well layer and a quantum barrier layer described below. Thereby, a subband level structure which is an energy level structure by the quantum well structures is formed in the unit laminate structure 16.

As shown in FIG. 2, the unit laminate structure 16 forming the active layer 15 in the quantum cascade laser 1A according to the present embodiment has, in addition to an emission upper level $L_{up}$ and an emission lower level $L_{low}$ relating to emission of light by intersubband transition, a relaxation miniband MB which is a miniband including a level that is an energy level lower than the emission lower level $L_{low}$ to function as a relaxation level in its subband level structure. This miniband MB is set such that an energy difference between the emission lower level $L_{low}$ and the miniband MB corresponds to energy $E_{LO}$ of LO phonons.

Further, in the unit laminate structure 16 shown in FIG. 2, an injection barrier layer for electrons to be injected from an injection layer 18a to the emission layer 17 is provided between the quantum well emission layer 17 and the injection layer 18a of the previous stage unit laminate structure. Further, an exit barrier layer for electrons from the emission layer 17 to the injection layer 18 is provided between the quantum well emission layer 17 and the injection layer 18. These barrier layers are provided as needed depending on the concrete laminate structure and subband level structure of the active layer 15 including the quantum well emission layers 17 and the injection layers 18.

In such a subband level structure, electrons e⁻ from the miniband MB in the previous stage injection layer 18a are injected into the emission upper level $L_{up}$ in the quantum well emission layer 17 via the injection barrier. The electrons injected into the emission upper level $L_{up}$ make an emission transition to the emission lower level $L_{low}$, and at this time, light hv at a wavelength corresponding to an energy difference between the subband levels of the upper level $L_{up}$ and the lower level $L_{low}$ is generated to be emitted.

The electrons which have made a transition to the emission lower level $L_{low}$ are relaxed at high speed to the relaxation miniband MB through the LO phonon scattering, and further relaxed at high speed in the miniband MB. In this way, the electrons are extracted at high speed from the emission lower level $L_{low}$ through LO phonon scattering and relaxation in the miniband, which forms an inverted population for realizing laser oscillation between the upper level $L_{up}$ and the lower level $L_{low}$.

Further, in the level structure, as shown in FIG. 2, the relaxation miniband MB has a band structure in which the miniband in the quantum well emission layer 17 and the miniband in the injection layer 18 are coupled. In such a structure, the electrons relaxed from the emission lower level $L_{low}$ to the relaxation miniband MB are injected in a cascade manner from the miniband MB to the emission upper level $L_{up}$ in the latter stage emission layer 17b via the exit barrier and the injection layer 18.

Such injection, emission transition, and relaxation of electrons are repeated in the plurality of unit laminate structures 16 forming the active layer 15, to generate light in a cascade manner in the active layer 15. That is, provided that the quantum well emission layers 17 and the injection layers 18 are alternatively laminated in large numbers, electrons successively move in a cascade manner through the laminate structures 16, and light hv is generated at the time of intersubband transition in each of the laminate structures 16. Further, such light is resonated by the optical resonator of the laser 1A, to generate laser light at a predetermined wavelength.

The effects of the quantum cascade laser 1A according to the present embodiment will be described.

In the quantum cascade laser 1A shown in FIGS. 1 and 2, not only the emission upper level $L_{up}$ and the emission lower level $L_{low}$ relating to emission of light, but also the relaxation miniband MB including energy levels lower than the emission lower level $L_{low}$ are provided in the subband level structure in the unit laminate structure 16 having the quantum well emission layer 17 and the injection layer 18. Then, the subband level structure is configured such that the energy difference between the emission lower level $L_{low}$ and the relaxation miniband MB corresponds to the energy $E_{LO}$ of the LO phonon.

In such a configuration, electrons which have passed through an emission transition between subbands in the quantum well emission layer 17 are to be extracted at high speed from the emission lower level $L_{low}$ through LO phonon scattering from the emission lower level $L_{low}$ to the miniband MB and relaxation in the miniband MB. Accordingly, it is possible to efficiently form an inverted population in the quantum well emission layer 17 and to lower a threshold of a laser operation thereby, which makes it possible to realize a laser element operating at high temperature, continuous wave, and high-power, whose laser operation performance has been improved.

Further, in the above described configuration using LO phonon scattering for extraction of electrons from the emission lower level $L_{low}$ to the relaxation miniband MB, an emission transition between the emission upper level $L_{up}$ and the lower level $L_{low}$ is not a transition between a miniband and a miniband or a transition between a subband and a miniband, but a transition between a subband and a subband. Thereby, an emission gain in the emission transition can be concentrated. Further, because the miniband MB is used for relaxation of electrons after intersubband transition, the structure design for relaxing electrons from the emission lower level $L_{low}$ is made easier, and it is possible to realize stabilization of their characteristics at the time of manufacturing laser elements and improvement in its yield. Note that, the subband level structure as described above can be controlled by a design of the quantum well structure in the unit laminate structure 16 forming the active layer 15.

Figure 3:
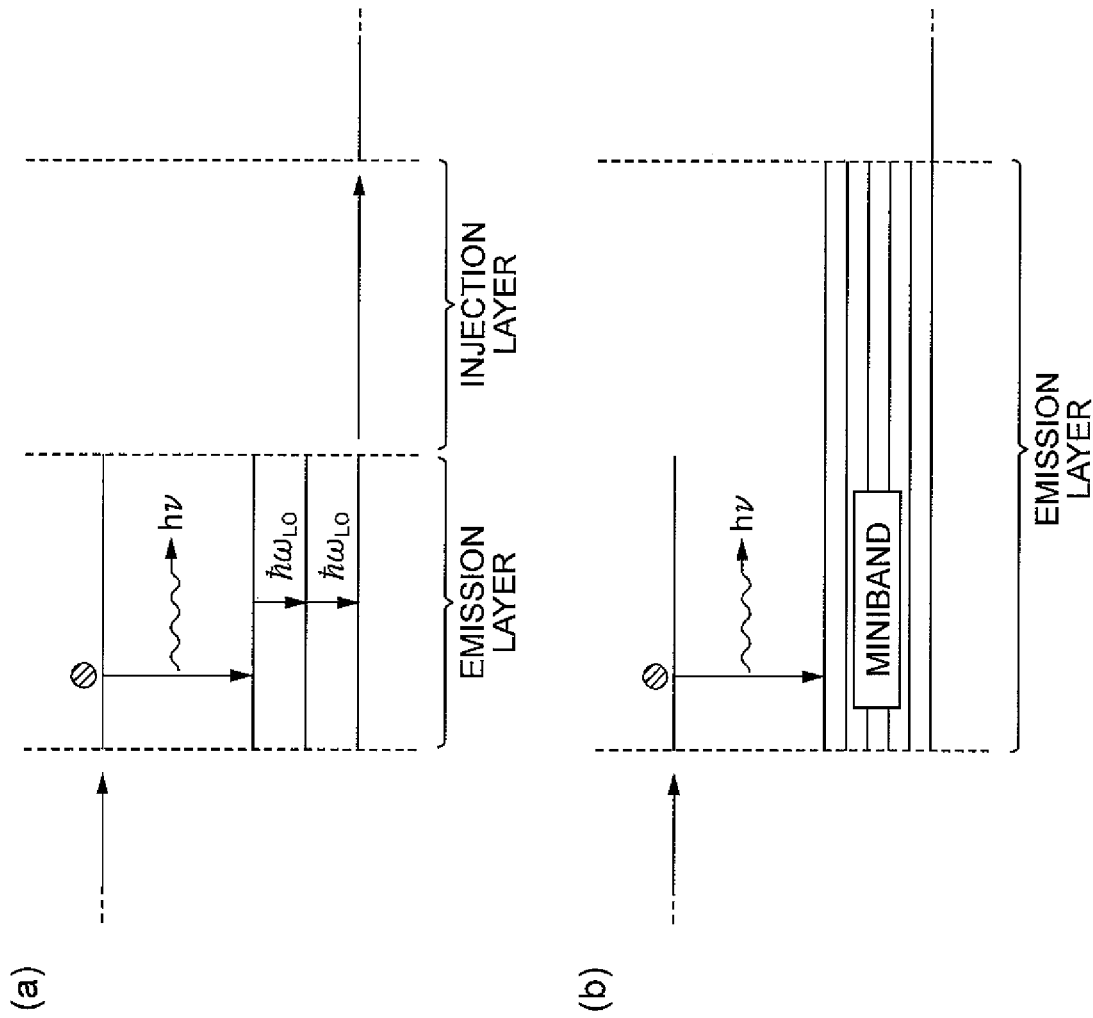
FIG. 3 shows diagrams showing subband level structures in active layers of conventional quantum cascade lasers.

An effect that a laser characteristic is improved by the above described subband level structure will be described in detail in comparison to a conventional structure. FIG. 3 is a diagram showing a subband level structure in an active layer in a conventional quantum cascade laser. In FIG. 3, a level structure (a) shows a double phonon resonance structure (refer to Patent Document 3: U.S. Pat. No. 6,751,244). Further, a level structure (b) shows a BTC (Bound to Continuum) structure (refer to Patent Document 4: U.S. Pat. No. 6,922, 427).

In the double phonon resonance structure shown in the level structure (a) of FIG. 3, with respect to the extraction of electrons from the emission lower level, an attempt is made to shorten a cattier lifetime in the emission lower level by extracting electrons through double-stage LO phonon scattering from the lower level (with respect to a carrier lifetime, refer to, for example, Document: D. Hofstetter et al., Appl. Phys. Lett. Vol. 78 (2001) pp. 396-398). As a quantum well structure for realizing such a level structure, for example, a quadruple quantum well structure in which one quantum well layer that is for providing two relaxation levels at a side having lower energy than the emission lower level is added, may be used in the quantum well emission layer.

However, in such a structure, quantum mechanical calculations for respective energy levels forming a subband level structure and its structure design are made complicated as compared with the conventional triple quantum well structure (refer to Patent Document 1: U.S. Pat. No. 5,457,709). Further, unless both of an energy difference between the emission lower level and the first stage relaxation level and an energy difference between the first stage relaxation level and the second stage relaxation level are made to correspond to the energy $E_{LO}$ of LO phonons, the characteristic may be inferior to the conventional triple quantum well structure, which brings about the problem that an optimum range in design or in manufacturing in which an excellent element performance can be obtained is narrow.

In this case, precise control for a layer thickness which is less than or equal to one molecular layer (ML) is required for crystal growth at the time of forming the active layer, characteristic fluctuations at the time of manufacturing laser elements occur, which may lower its yield in manufacturing. At the thought of mass production of elements by an MOVPE (metal-organic-vapor-phase epitaxy) method etc. toward application of quantum cascade lasers to the industry, such a decrease in yield is an extremely serious problem.

On the other hand, the BTC structure shown in the level structure (b) of FIG. 3 is a structure, in the structure using a transition between minibands of superlattices (refer to Patent Document 2: U.S. Pat. No. 5,745,516), with respect to the upper miniband, in the upper miniband corresponding to the emission upper level and the lower miniband corresponding to the emission lower level, a subband of the lowest energy in the miniband is separated from the miniband to become the emission upper level.

However, in the BTC structure in which the emission upper level is separated as well, an emission transition therein is a transition to the lower miniband, which brings about the problem that an emission gain is still deconcentrated to broaden a half value of width in emission of light. Further, in an emission transition from the emission upper level to the lower miniband, a diagonal transition that electrons substantially come across a plurality of quantum well layers becomes dominant, and its emission characteristic is easily influenced by the growth interfaces of the quantum well layers.

In contrast thereto, in the subband level structure of the quantum cascade laser 1A according to the present invention shown in FIG. 2, the improvement in the characteristic of the laser element is realized by combining extraction of electrons at high speed through LO phonon scattering from the emission lower level $L_{low}$ to the miniband MB and relaxation of electrons at high speed in the miniband MB formed from superlattices.

In such a structure, because electrons are relaxed from the emission lower level $L_{low}$ to the miniband MB, it is possible to further shorten a carrier lifetime at the emission lower level $L_{low}$ more than that in a double phonon resonance structure. That is, because there are many levels in which electrons can be relaxed from the lower level $L_{low}$ in relaxation of electrons from the emission lower level $L_{low}$ to the miniband MB, a carrier lifetime in the emission lower level $L_{low}$ is shortened.

Further, even though the miniband MB is utilized in this way, an emission transition itself is a transition between subbands from the emission upper level $L_{up}$ to the lower level $L_{low}$, therefore, an emission gain is not deconcentrated, that is different from the BTC structure, and a gain of the emission can be concentrated. Further, in an emission transition from the emission upper level $L_{up}$ to the lower level $L_{low}$, a vertical transition that electrons make a transition in a same quantum well layer becomes dominant, and its emission characteristic is hard to be influenced by the growth interfaces of the quantum well layers.

Further, in the double phonon resonance structure utilizing two-stage LO phonon scattering, as described above, there is the problem that the structure design thereof is difficult, and an optimum range for crystal growth in which an excellent element performance can be obtained is narrow. In contrast thereto, in the level structure shown in FIG. 2, provided that the structure in which electrons from the emission lower level $L_{low}$ are relaxed to the miniband MB through LO phonon scattering is adopted, the above described problem in the double phonon resonance structure as well can be overcome.

That is, in the above described structure utilizing the miniband MB for a part of the process of carrier relaxation, it is possible to obtain a stable and sufficient element characteristic even if there are certain fluctuation levels in the respective layer thicknesses in the active layer. Further, a yield improvement in manufacturing can be expected by relaxing the conditions for accuracy in design and in manufacturing of laser elements. Such a yield improvement is extremely important in consideration of mass production of laser elements at low cost by using an MOVPE method, etc.

Here, the emission lower level $L_{low}$ in the subband level structure shown in FIG. 2 may be configured such that one subband in the relaxation miniband MB (a subband of the highest energy in the miniband MB) is separated away by the energy $E_{LO}$ of the LO phonon from the other subbands to the higher energy side, and the separated level is set as the emission lower level $L_{low}$. Thereby, it is possible to preferably realize the level structure including the emission lower level $L_{low}$, and the relaxation miniband MB separated by the energy $E_{LO}$ of LO phonons from the emission lower level.

Further, with respect to the quantum well structure in the active layer 15, as shown in FIG. 2, in the unit laminate structure 16, the exit barrier layer for electrons from the quantum well emission layer 17 to the injection layer 18 is preferably provided between the quantum well emission layer 17 and the injection layer 18. In accordance therewith, it is possible to prevent a wave function of electrons from leaking out of the injection layer 18 to the emission layer 17, which makes it possible to improve the efficiency of emission transition in the emission layer 17. That is, an optical transition contributing to laser oscillation is certainly made between the subbands of the emission upper level $L_{up}$ and the lower level $L_{low}$ by preventing a wave function of electrons from leaking out in this way, which causes carriers from the lower level $L_{low}$ to be relaxed into the miniband MB through one-stage LO phonon scattering.

Further, the relaxation miniband MB preferably has a band structure in which a miniband in the quantum well emission layer 17 and a miniband in the injection layer 18 are coupled. By strongly connecting the miniband in the emission layer 17 and the miniband in the injection layer 18 in this way, it is possible to extremely shorten a tunnel time $\tau_{esc}$ of electrons from the emission layer 17 to the injection layer 18, that has been problematic in a triple quantum well structure. Further, as shown in FIG. 2, providing a minigap in the injection layer 18 enables to preventing a transition unrelated to laser oscillation causing carrier leak from occurring.

Figure 4:
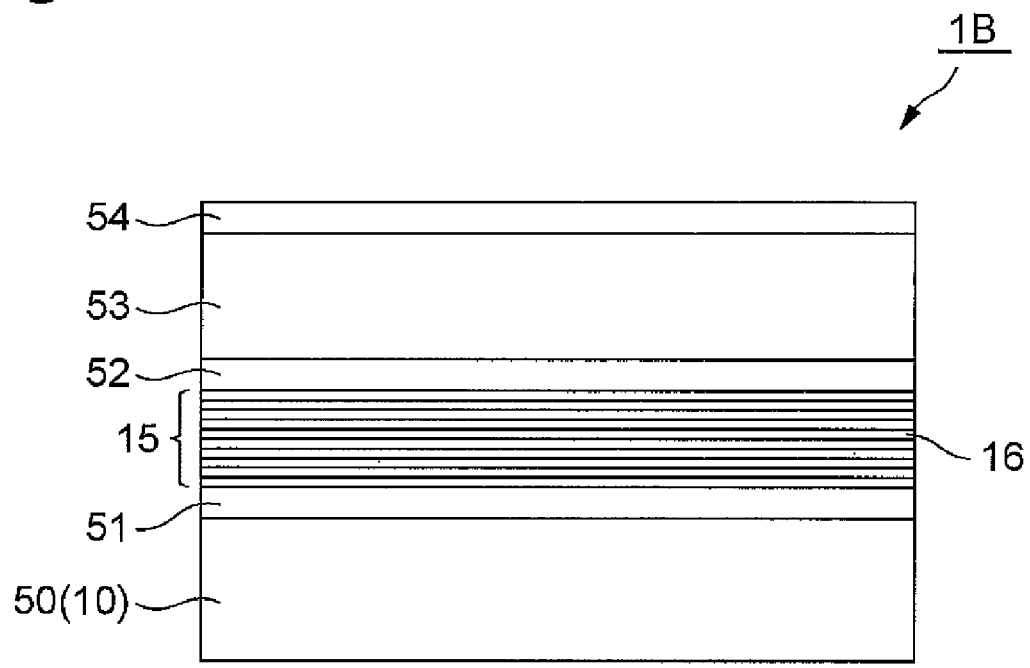
FIG. 4 is a diagram showing an example of a configuration of the quantum cascade laser.
Figure 5:
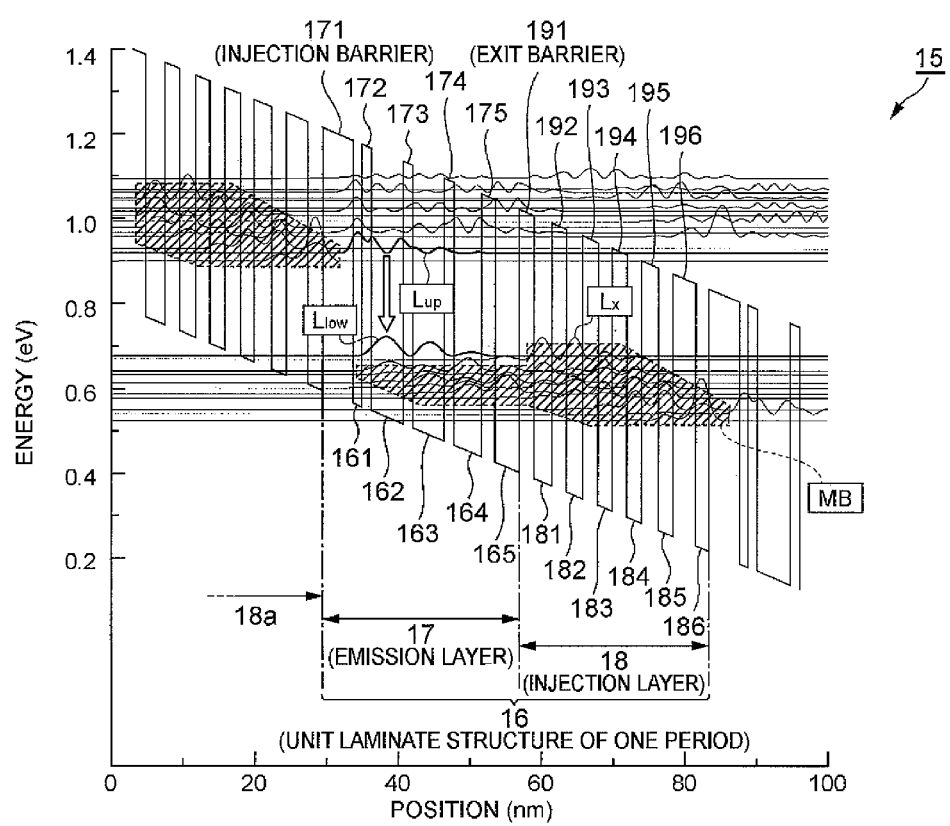
FIG. 5 is a diagram showing an example of a configuration of a unit laminate structure forming the active layer.

The configuration of the quantum cascade laser according to the present invention will be further described with reference to a concrete example of the element structure including the quantum well structure in the active layer. FIG. 4 is a diagram showing an example of a concrete configuration of the quantum cascade laser. Further, FIG. 5 is a diagram showing an example of a configuration of a unit laminate structure forming the active layer in the quantum cascade laser shown in FIG. 4.

As the quantum well structure of the active layer 15 in the present configuration example, an example in which the structure is designed such that an oscillation wavelength is 5.2 μm and an operating electric field is 70 kV/cm is shown. Note that, in FIG. 5, a quantum well structure and a subband level structure of a part of a multi-stage repetitive structure including the quantum well emission layers 17 and the injection layers 18 forming the active layer 15 are shown. Further, the element structure shown in FIGS. 4 and 5 can be formed through crystal growth by, for example, a molecular beam epitaxy (MBE) method or a metal-organic-vapor-phase epitaxy (MOVPE) method.

In the semiconductor laminated structure of a quantum cascade laser 1B shown in FIG. 4, an n-type InP monocrystalline substrate 50 is used as the semiconductor substrate 10. Then, an InGaAs lower core layer 51 with a thickness of 400 nm, the active layer 15 in which the unit laminate structures 16 are laminated in multiple stages, an InGaAs upper core layer 52 with a thickness of 400 nm, an InP cladding layer 53 with a thickness of 3 μm, and an InGaAs contact layer 54 with a thickness of 10 nm are sequentially laminated in order from the substrate side on the InP substrate 50, to form the element structure of the quantum cascade laser 1B. Further, in this laminated structure, the core layers 51 and 52, the cladding layer 53, and the contact layer 54 except for the active layer 15 are lattice-matched to the InP substrate 50.

The active layer 15 in the present configuration example is configured such that the unit laminate structures 16 including the quantum well emission layers 17 and the electron injection layers 18 are laminated in thirty periods. Further, as shown in FIG. 5, the unit laminate structure 16 of one period is configured as a quantum well structure in which eleven quantum well layers 161 to 165 and 181 to 186, and eleven quantum barrier layers 171 to 175 and 191 to 196 are alternately laminated.

Among these respective semiconductor layers, the quantum well layers are formed of InGaAs layers into which lattice mismatch (compression strain) of +1% with respect to the InP substrate 50 is introduced. Further, the quantum barrier layers are formed of InAlAs layers into which lattice mismatch (tensile strain) of −1% with respect to the InP substrate 50 is introduced. Further, the unit laminate structures 16 and the active layer 15 become a strain compensation structure as a whole that compensates for lattice strain by alternately laminating the above described quantum well layers and quantum barrier layers. In accordance with such a structure, a band offset ΔEc of its conduction band can be set to be greater than that in a case in which the layers are lattice-matched to the substrate. In this case, it is possible to increase the element design freedom, efficiently confine carriers, and shorten an oscillation wavelength.

Further, with respect to the quantum well emission layer 17 and the injection layer 18 in the unit laminate structure 16 as described above, the laminated portion including the quantum well layers 161 to 165 and the quantum barrier layers 171 to 175 is a portion mainly serving as the emission layer 17 in the laminate structure shown in FIG. 5. Further, the laminated portion including the quantum well layers 181 to 186 and the quantum barrier layers 191 to 196 is a portion mainly serving as the injection layer 18.

Further, among the respective semiconductor layers in the emission layer 17, the first stage quantum barrier layer 171 is located between the previous stage injection layer 18a and the emission layer 17, to become an injection barrier layer for electrons from the previous injection layer 18a to the emission layer 17. In the same way, among the respective semiconductor layers in the injection layer 18, the first stage quantum barrier layer 191 is located between the emission layer 17 and the injection layer 18, to become an exit barrier layer for electrons from the emission layer 17 to the injection layer 18. FIG. 6 shows an example of a concrete structure of the unit laminate structure 16 of one period in the active layer 15.

In such a structure, the unit laminate structure 16 has an emission upper level $L_{up}$, an emission lower level $L_{low}$, and a relaxation miniband MB in the subband level structure shown in FIG. 5. In the present configuration example, the emission lower level $L_{low}$ is separated by approximately 34 meV corresponding to the energy of the LO phonon from the miniband MB to the higher energy side. Such separation of the emission lower level $L_{low}$ and the miniband MB can be designed by combining respective layer thicknesses of the quantum well layers and the barrier layers forming the quantum well emission layer 17. Further, with respect to the extraction of electrons from the emission lower level $L_{low}$, a carrier lifetime in the lower level $L_{low}$ is estimated as 0.19 ps, which provides a sufficiently short carrier lifetime.

Further, with respect to the injection of electrons from the previous stage injection layer 18a to the quantum well emission layer 17, by providing the thin quantum well layer 161 so as to be immediately adjacent to the injection barrier layer 171, high efficiency of injecting electrons to the emission upper level $L_{up}$ is realized. Then, these configurations enable to efficiently form an inverted population in the quantum well emission layer 17. Note that the present configuration example shows an example of a configuration in a case in which an oscillation wavelength is set to 5.2 μm as described above. Generally, with respect to the semiconductor laminated structure in the active layer 15, the compositions, layer thicknesses, and doping of the respective semiconductor layers, or the structure of the entire laser element, etc., not only the configuration examples shown in FIGS. 4 to 6, but also various configurations may be concretely used.

Further, in the configuration example shown in FIG. 5, it is possible to prevent a wave function from leaking out of the injection layer 18 to the emission layer 17 as described above, by adjusting a layer thickness of the exit barrier layer 191 provided between the quantum well emission layer 17 and the injection layer 18.

Here, in order to describe the effect of preventing a wave function from leaking out, a level $L_x$ at the highest energy side among the levels having the centers of their wave functions in the injection layer 18 in the subband level structure of FIG. 5 will be considered. Then, with respect to such a level $L_x$, a ratio $f_x/f$ of oscillator strength f from the emission upper level $L_{up}$ to the emission lower level $L_{low}$ and oscillator strength $f_x$ to the level $L_x$ will be examined. Where, when a ratio $f_x/f$ of the oscillator strengths is 1, the oscillator strengths of the transitions from the emission upper level $L_{up}$ to the emission lower level $L_{low}$ and to the level $L_x$ are the same.

Figure 7:
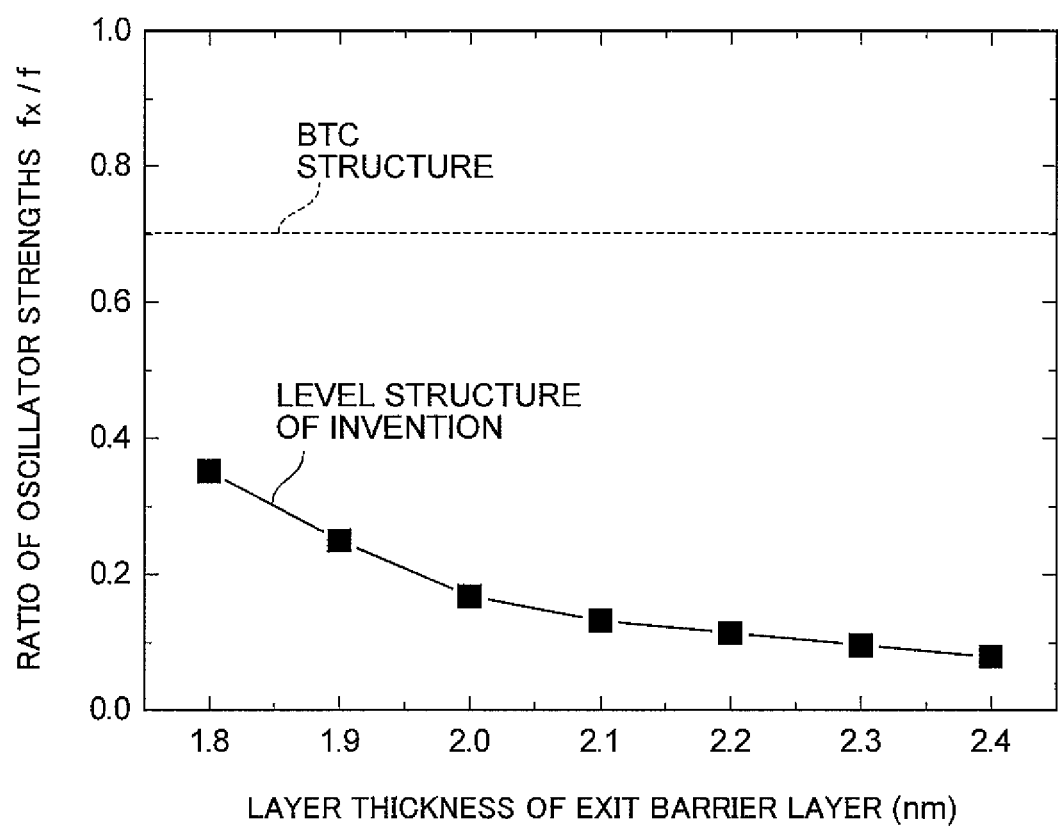
FIG. 7 is a graph showing a correlation between a layer thickness of an exit barrier layer and a ratio of oscillator strengths.

FIG. 7 is a graph showing a correlation between a layer thickness of the exit barrier layer 191 and a ratio $f_x/f$ of the oscillator strengths. In this graph, the layer thicknesses (nm)

of the exit barrier layer are plotted on the abscissa and the above described ratios $f_x/f$ of the oscillator strengths are plotted on the ordinate. Note that the positions of the respective levels in the subband level structure vary depending on electric fields. Here, the calculations of the oscillator strengths have been performed assuming that the target level $L_x$ is located at the higher energy side by 5 meV from the emission lower level $L_{low}$.

The graph of FIG. 7 shows variations of the ratios $f_x/f$ of the oscillator strengths when the layer thickness of the exit barrier layer 191 is made to vary within a range from 1.8 nm to 2.4 nm in the subband level structure shown in FIG. 5. Further, for comparison, a value of the ratio $f_x/f$ of the oscillator strengths in the BTC structure at a wavelength equivalent to that in the example (Document: S. Blaser et al., "Room-Temperature, Continuous-Wave, Single-Mode Quantum-Cascade Lasers at $\lambda \sim 5.4$ μm", Appl. Phys. Lett. Vol. 86 (2005) 041109) is also shown by a dashed line.

As shown in the graph, in the BTC structure, the transition to the level $L_x$ in the injection layer 18 has occurred at the oscillator strength $f_x$ of 70% for the oscillator strength f from the emission upper level $L_{up}$ to the emission lower level $L_{low}$. Such occurrence of a transition to the level $L_x$ in the injection layer 18 causes lowering in the operating efficiency of the laser element. In contrast thereto, in the level structure of the present invention, the ratios $f_x/f$ of the oscillator strengths are smaller than that in the BTC structure, which has improved the emission efficiency.

Moreover, in such a structure, a layer thickness of the exit barrier layer is made thicker to further decrease a value of the ratio $f_x/f$ of the oscillator strengths. This means that it is possible to control the leaking-out of a wave function from the injection layer 18 to the emission layer 17 depending on a layer thickness of the exit barrier layer. In this way, an emission transition in the quantum well emission layer 17 can be certainly made to be a vertical transition by preventing a wave function from leaking out. Note that, provided that a layer thickness of the exit barrier layer is made thicker, a wave function is prevented from leaking out, and on the other hand, a coupling of minibands between the emission layer 17 and the injection layer 18 weakens. Accordingly, such a layer thickness of the exit barrier layer is preferably designed in consideration of the balance of those.

The function of such an exit barrier layer is to keep a connection of minibands between an emission layer and an injection layer while preventing a wave function from leaking out as described above. In order to realize such a function, a thickness of the exit barrier layer is preferably thicker than a thickness of the barrier layer (the barrier layer 192 in the example of FIG. 5) closest to the emission layer in the injection layer (except for the exit barrier layer). Further, a thickness of the exit barrier layer is preferably thinner than that of the injection barrier layer.

The quantum cascade laser according to the present invention is not limited to the above described embodiment and configuration example, and various modifications thereof are possible. For example, in the above described configuration example, the example of the configuration in which the InP substrate is used as a semiconductor substrate and the active layer is formed of InGaAs/InAlAs has been shown, however, in detail, various configurations capable of making an emission transition by intersubband transition in a quantum well structure, and realizing the subband level structure described above may be used.

With respect to such a semiconductor material system, not only InGaAs/InAlAs described above, but also various material systems such as GaAs/AlGaAs, InAs/AlSb, GaN/AlGaN, and SiGe/Si may be used, for example. Further, various methods may be used as a semiconductor crystal growth method.

Further, not only the structure shown in FIG. 4, but also various structures may be used as a semiconductor laminated structure as the entire laser element of the quantum cascade laser. Generally, it suffices for a quantum cascade laser to include a semiconductor substrate and an active layer having the above described configuration provided on the semiconductor substrate.

The quantum cascade laser according to the above described embodiment includes (1) a semiconductor substrate, and (2) an active layer which is provided on the semiconductor substrate, and in which unit laminate structures having quantum well emission layers and injection layers are laminated in multiple stages to form a cascade structure in which the quantum well emission layers and the injection layers are alternately laminated, and in the quantum cascade laser, (3) each of the unit laminate structures included in the active layer has an emission upper level, an emission lower level, and a relaxation miniband including an energy level lower than the emission lower level to function as a relaxation level in a subband level structure thereof, and (4) light is generated by an intersubband transition of electrons from the emission upper level to the emission lower level in the quantum well emission layer, and the electrons after the intersubband transition are relaxed from the emission lower level to the relaxation miniband through longitudinal optical phonon scattering, to be injected from the injection layer to the quantum well emission layer in the latter stage unit laminate structure via the relaxation miniband.

Here, the emission lower level in the above described subband level structure may be configured such that one subband in the relaxation miniband is separated away by the energy of the longitudinal optical phonon from the other subbands to the higher energy side, and the separated level is set as the emission lower level. Thereby, it is possible to appropriately realize a level structure including the emission lower level, and the relaxation miniband separated by the energy of LO phonons from the emission lower level.

Further, in the unit laminate structure, an exit barrier layer for electrons from the quantum well emission layer to the injection layer is preferably provided between the quantum well emission layer and the injection layer. Thereby, it is possible to prevent a wave function of electrons from leaking out of the injection layer to the emission layer, which makes it possible to improve the efficiency of an emission transition in the quantum well emission layer.

Further, the relaxation miniband preferably has a band structure in which a miniband in the quantum well emission layer and a miniband in the injection layer are coupled. Thereby, it is possible to shorten a tunnel time $\tau_{esc}$ of electrons from the quantum well emission layer to the injection layer, which makes it possible to prevent extraction of electrons at high speed from the emission lower level from being substantially limited.

INDUSTRIAL APPLICABILITY

The present invention can be utilized as a quantum cascade laser, which is capable of efficiently forming an inverted population in a quantum well emission layer, to improve its laser operation performance.

The invention claimed is:
1. A quantum cascade laser comprising:
a semiconductor substrate; and
an active layer which is provided on the semiconductor substrate, and in which unit laminate structures having quantum well emission layers and injection layers are laminated in multiple stages to form a cascade structure in which the quantum well emission layers and the injection layers are alternately laminated, wherein each of the unit laminate structures included in the active layer has an emission upper level, an emission lower level, and a relaxation miniband including energy levels lower than the emission lower level to function as relaxation levels in a subband level structure in the quantum well emission layer, the relaxation miniband is set such that an energy difference between the emission lower level and the relaxation miniband corresponds to energy of longitudinal optical phonon, and light is generated by an intersubband transition of electrons from the emission upper level to the emission lower level in the quantum well emission layer, and the electrons after the intersubband transition are relaxed from the emission lower level to the relaxation miniband through longitudinal optical phonon scattering, to be injected to the quantum well emission layer in the latter stage unit laminate structure from the relaxation miniband in the quantum well emission layer via the injection layer.

2. The quantum cascade laser according to claim 1, wherein the emission lower level is composed of a level in which one subband in the relaxation miniband is separated away by energy of the longitudinal optical phonon to a higher energy side from the other subbands.

3. The quantum cascade laser according to claim 1, wherein an exit barrier layer for electrons from the quantum well emission layer to the injection layer is provided between the quantum well emission layer and the injection layer in the unit laminate structure.

4. The quantum cascade laser according to claim 1, wherein the relaxation miniband has a band structure in which a miniband in the quantum well emission layer and a miniband in the injection layer are coupled.

* * * * *